(12) United States Patent
Duvnjak

(10) Patent No.: US 11,444,545 B2
(45) Date of Patent: Sep. 13, 2022

(54) MULTIPLE STAGE GATE DRIVE FOR CASCODE CURRENT SENSING

(71) Applicant: Power Integrations, Inc., San Jose, CA (US)

(72) Inventor: Rajko Duvnjak, Kanata (CA)

(73) Assignee: Power Integrations, Inc., San Jose, CA (US)

( * ) Notice: Subject to any disclaimer, the term of this patent is extended or adjusted under 35 U.S.C. 154(b) by 88 days.

(21) Appl. No.: 17/146,521

(22) Filed: Jan. 12, 2021

(65) Prior Publication Data

US 2021/0211065 A1    Jul. 8, 2021

Related U.S. Application Data

(63) Continuation of application No. 16/821,013, filed on Mar. 17, 2020, now Pat. No. 10,924,028, which is a (Continued)

(51) Int. Cl.
*H02M 7/162*     (2006.01)
*H02M 7/12*      (2006.01)
(Continued)

(52) U.S. Cl.
CPC ........ *H02M 7/1626* (2013.01); *H02H 1/0007* (2013.01); *H02H 7/1227* (2013.01);
(Continued)

(58) Field of Classification Search
CPC .......... H02M 7/1626; H02M 3/33507; H02M 7/125; H02M 1/32; H02M 1/12;
(Continued)

(56) References Cited

U.S. PATENT DOCUMENTS 4,808,853 A    2/1989   Taylor
4,823,069 A    4/1989   Callahan et al.
(Continued)

FOREIGN PATENT DOCUMENTS

DE    10217611 B4    11/2003
JP    H0946201 A      2/1997
(Continued)

OTHER PUBLICATIONS

European Patent Application No. 18161450.4—Examination Report dated Dec. 9, 2020, 8 pgs.
(Continued)

*Primary Examiner* — Kyle J Moody
(74) *Attorney, Agent, or Firm* — Power Integrations, Inc.

(57) ABSTRACT

A power converter comprising an energy transfer element is coupled between an input of the power converter and an output of the power converter. A cascode circuit generates a first sense signal and a second sense signal. A controller controls the switching of the cascode circuit to transfer energy from the input of the power converter to the output of the power converter. The controller comprising a current sense circuit generates a current limit signal and an overcurrent signal in response to the first sense signal and the second sense signal. A control circuit generates a control signal in response to the current limit signal and the overcurrent signal. A drive circuit comprising a first stage gate drive circuit generates a drive signal in response to the control signal to reduce EMI, and a second stage of gate drive circuit to enable accurate current sensing of the cascode circuit.

14 Claims, 5 Drawing Sheets

Related U.S. Application Data continuation of application No. 16/242,915, filed on Jan. 8, 2019, now Pat. No. 10,637,368, which is a continuation of application No. 15/917,432, filed on Mar. 9, 2018, now Pat. No. 10,218,286, which is a continuation of application No. 15/620,018, filed on Jun. 12, 2017, now Pat. No. 9,954,461.

(51) Int. Cl.

| | |
|---|---|
| H02H 7/122 | (2006.01) |
| H02M 1/32 | (2007.01) |
| H02M 1/12 | (2006.01) |
| H02M 1/44 | (2007.01) |
| H02M 3/335 | (2006.01) |
| H03K 17/082 | (2006.01) |
| H03K 17/10 | (2006.01) |
| H03K 17/16 | (2006.01) |
| H03K 17/687 | (2006.01) |
| H02H 1/00 | (2006.01) |
| G01R 19/00 | (2006.01) |
| H02M 1/00 | (2006.01) |

(52) U.S. Cl.
CPC .............. *H02M 1/12* (2013.01); *H02M 1/32* (2013.01); *H02M 1/44* (2013.01); *H02M 3/33507* (2013.01); *H02M 7/125* (2013.01); *H03K 17/0822* (2013.01); *H03K 17/102* (2013.01); *H03K 17/163* (2013.01); *H03K 17/6871* (2013.01); *G01R 19/0092* (2013.01); *H02M 1/0009* (2021.05); *H03K 2017/6875* (2013.01)

(58) Field of Classification Search
CPC .. H02M 1/44; H02M 2001/0009; H02M 1/08; H02M 3/335; H02H 1/0007; H02H 7/1227; H03K 17/0822; H03K 17/102; H03K 17/163; H03K 17/6871; H03K 2017/6875; G01R 19/0092
See application file for complete search history.

(56) References Cited

U.S. PATENT DOCUMENTS

| | | | |
|---|---|---|---|
| 5,742,183 A | 4/1998 | Kuroda | |
| 6,333,665 B1 | 12/2001 | Ichikawa | |
| 6,476,683 B1 | 11/2002 | Saito et al. | |
| 7,034,600 B2 | 4/2006 | Scheikl | |
| 8,207,760 B2 | 6/2012 | Pham | |
| 8,598,937 B2 | 12/2013 | Lal et al. | |
| 9,219,420 B1 | 12/2015 | Zhang et al. | |
| 9,455,639 B2 | 9/2016 | Hayakawa et al. | |
| 9,479,159 B2 | 10/2016 | Zojer | |
| 10,135,357 B1* | 11/2018 | Balakrishnan | H02M 3/3353 |
| 2004/0021498 A1 | 2/2004 | Scheikl | |
| 2004/0036511 A1 | 2/2004 | Otoshi et al. | |
| 2007/0236962 A1 | 10/2007 | Minkkinen | |
| 2012/0223746 A1 | 9/2012 | Pham | |
| 2013/0101758 A1 | 4/2013 | Taghavi | |
| 2013/0107584 A1 | 5/2013 | Li et al. | |
| 2014/0043867 A1 | 2/2014 | Sugawara et al. | |
| 2014/0070786 A1 | 3/2014 | Guerra et al. | |

FOREIGN PATENT DOCUMENTS

| | | |
|---|---|---|
| JP | 2004140423 A | 5/2004 |
| JP | 4190853 B2 | 12/2008 |
| JP | 2012074829 A | 4/2012 |
| JP | 2013258778 A | 12/2013 |
| JP | 2014236643 A | 12/2014 |
| JP | 2015195677 A | 11/2015 |
| JP | 2016027775 A | 2/2016 |

OTHER PUBLICATIONS

European Patent Application No. 1816450.4—Extended Search Report dated Sep. 7, 2018, 8 pages.

Hui Li, "Application Note for Switching Mode Power Supply Design with 900V Switching Regulator—MP110", Application Note AN084, MPS The Future of Analog IC Technology, Jun. 2014, 45 pgs.

Mark Hartman, "Inside Current-Mode Control", Analyzing Power Modules, Power Designer, Expert tips, tricks, and techniques for powerful design, Dec. 31, 2005, pp. 1-8.

Yong Wang, "Design Consideration with 4P3409/A", Application note 1051, BCD Semiconductor Manufacturing Limited, Dec. 31, 2010, pp. 1-6.

Japanese Notice of Reasons for Refusal and Machine Translation; Application No. 2018-046330; dated Mar. 2, 2022; 21 pages.

Japanese Search Report and Machine Translation; Application No. 2018-046330; dated Mar. 8, 2022; 37 pages.

* cited by examiner

MULTIPLE STAGE GATE DRIVE FOR CASCODE CURRENT SENSING

CROSS-REFERENCE TO RELATED APPLICATIONS

This application is a continuation of U.S. patent application Ser. No. 16/821,013, filed on Mar. 17, 2020, now pending, which is a continuation of U.S. patent application Ser. No. 16/242,915, filed on Jan. 8, 2019, now pending, which is a continuation of U.S. patent application Ser. No. 15/917,432, filed on Mar. 9, 2018, now U.S. Pat. No. 10,218,286, which is a continuation of U.S. patent application Ser. No. 15/620,018, filed on Jun. 12, 2017, now U.S. Pat. No. 9,954,461. U.S. patent application Ser. No. 16/821,013, U.S. patent application Ser. No. 16/242,915, U.S. Pat. Nos. 10,218,286 and 9,954,461 are hereby incorporated by reference in their entirety.

BACKGROUND INFORMATION

Field of the Disclosure

The present invention relates generally to power converters, and more specifically, for an optimal drive which improves the current sensing for cascode switches in power converters.

Background

Electronic devices (such as cell phones, tablets, laptops, etc.) use power to operate. Switched mode power converters are commonly used due to their high efficiency, small size, and low weight to power many of today's electronics. Conventional wall sockets provide a high voltage alternating current. In a switching power converter, a high voltage alternating current (ac) input is converted to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
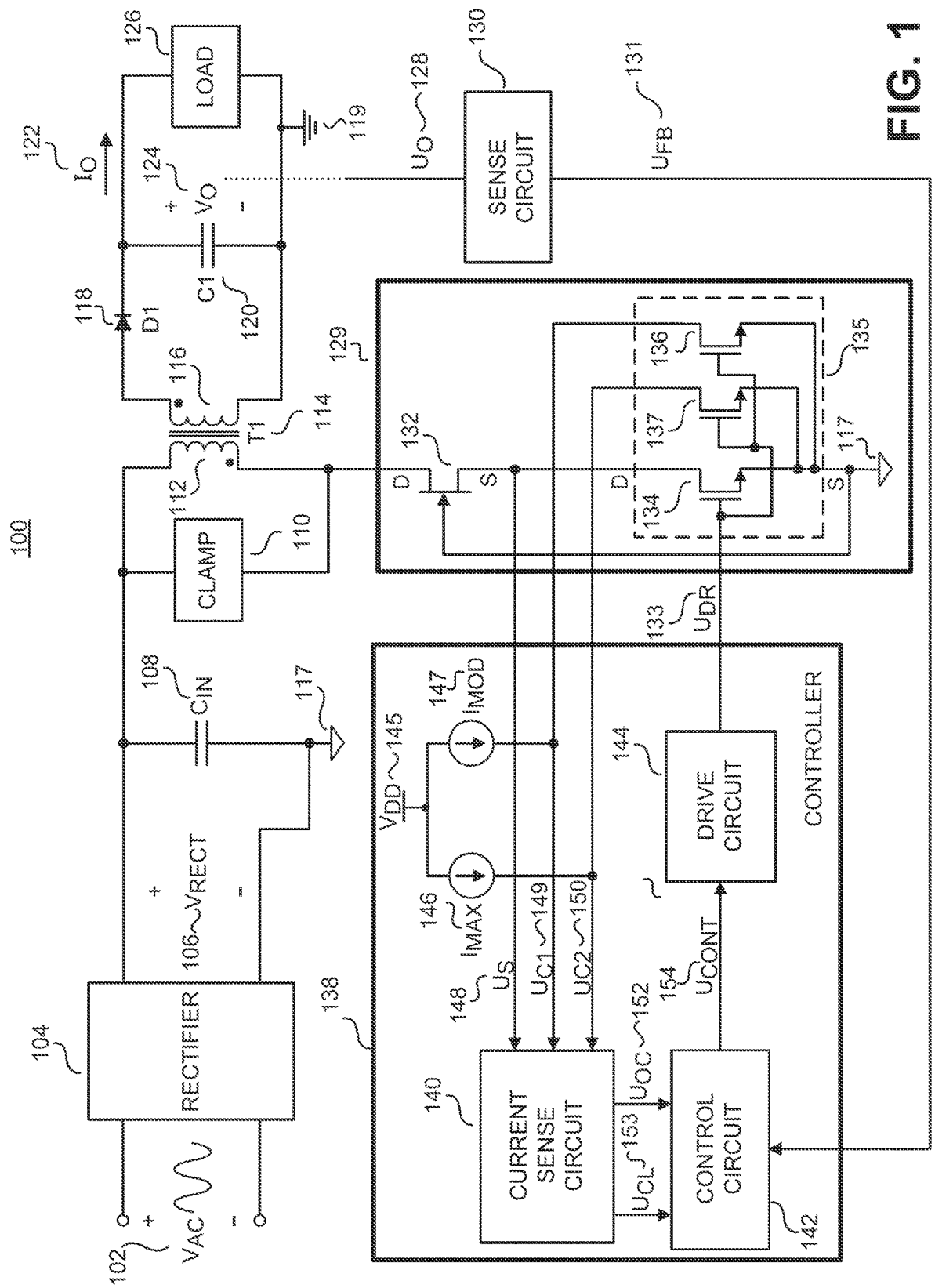
FIG. 1 is a block diagram illustrating an example power converter with a controller and a cascode switch in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a power converter with a controller for improving the turn on of a cascode circuit with current sensing are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Cascode circuits may use multiple stage gate drives in order to reduce electromagnetic interference (EMI) associated with a switch during turn on of the switch. Current sensing of a cascode circuit may be implemented by sensing the voltage across a low voltage switch. When the control switch is not fully enhanced, the drain source resistance ($RDS_{ON}$) is not at a nominal value and returns inaccurate current values. Associated circuitry such as overcurrent protection may not function properly due to inaccurate current sensing. To provide accurate current sensing, the control switch must be fully enhanced in order to have a $RDS_{ON}$ at the nominal value. However, quickly turning ON the control switch increases the EMI.

In one example, an optimal operation for the cascode circuit includes a multiple stage gate drive that turns on the switch slowly with a weak turn on drive signal to provide low EMI from the switch. After a delay, the multiple stage gate drive then fully turns on the switch with a strong turn on drive signal to provide accurate current sensing of the switch quickly in accordance with the teachings of the present invention. In other words, the drive of the drive signal is initially weak at first during the weak turn on of the drive signal. After the delay, the drive of the drive signal is stronger during the strong turn on of the drive signal. During the weak turn on of the drive signal, the switch is turned on slowly, which reduces EMI. However, after the delay the drive signal becomes a strong turn on drive signal, which quickly turns on the switch fully, which enables accurate current sensing in accordance with the teachings of the present invention.

To illustrate, FIG. 1 shows a functional block diagram of an example power converter 100 that is illustrated including an ac input voltage $V_{AC}$ 102, a rectifier 104, a rectified voltage $V_{RECT}$ 106, an input capacitor $C_{IN}$ 108, a clamp circuit 110, an energy transfer element T1 114, a primary winding 112 of the energy transfer element T1 114, a secondary winding 116 of the energy transfer element T1 114, an input return 117, a rectifier D1 118, an output return 119, an output capacitor C1 120 coupled to a load 126, a cascode circuit 129, a sense circuit 130, and a controller 138.

FIG. 1 further illustrates an output voltage $V_O$ 124, an output current $I_O$ 122, an output quantity $U_O$ 128, a feedback signal $U_{FB}$ 131, a source signal $U_S$ 148 of transistor 132, a first sense finger signal $U_{C1}$ 149, and a second sense finger signal $U_{C2}$ 150.

Controller 138 further includes a current sense circuit 140, a control circuit 142, a drive circuit 144, current sources 146 and 147, and a resistor 151.

The example switched mode power converter 100 illustrated in FIG. 1 is coupled in a flyback configuration, which is just one example topology of a switched mode power converter that may benefit from the teachings of the present invention. It is appreciated that other known topologies and configurations of switched mode power converters may also benefit from the teachings of the present invention. In addition, the example power converter shown in FIG. 1 is an isolated power converter. It should be appreciated that non-isolated power converters may also benefit from the teachings of the present invention.

The power converter 100 provides output power to the load 126 from an unregulated input voltage. In one embodiment, the input voltage is the ac input voltage $V_{AC}$ 102. In another embodiment, the input voltage is a rectified ac input voltage such as rectified voltage $V_{RECT}$ 106. The rectifier 104 outputs rectified voltage $V_{RECT}$ 106. In one embodiment, rectifier 104 may be a bridge rectifier. The rectifier 104 further couples to the energy transfer element T1 114. In some embodiments of the present invention, the energy transfer element T1 114 may be a coupled inductor. In other embodiments, the energy transfer element T1 114 may be a transformer. In a further example, the energy transfer element T1 114 may be an inductor. In the example of FIG. 1, the energy transfer element T1 114 includes two windings, a primary winding 112 and a secondary winding 116. However, it should be appreciated that the energy transfer element T1 114 may have more than two windings. In the example of FIG. 1, primary winding 112 may be considered an input winding, and secondary winding 116 may be considered an output winding. The primary winding 112 is further coupled to a normally-on switch 132 and a control switch 135, which is then further coupled to input return 117.

In addition, the clamp circuit 110 is illustrated in the example of FIG. 1 as being coupled across the primary winding 112 of the energy transfer element T1 114. The input capacitor $C_{IN}$ 108 may be coupled across the primary winding 112 and normally-on switch 132. In other words, the input capacitor $C_{IN}$ 108 may be coupled to the rectifier 104 and input return 117.

Secondary winding 116 of the energy transfer element T1 114 is coupled to the rectifier D1 118. In the example of FIG. 1, the rectifier D1 118 is exemplified as a diode. Both the output capacitor C1 120 and the load 126 are shown in FIG. 1 as being coupled to the rectifier D1 118. An output is provided to the load 126 and may be provided as either a regulated output voltage $V_O$ 124, a regulated output current $I_O$ 122, or a combination of the two.

The power converter 100 further comprises circuitry to regulate the output, which is exemplified as output quantity $U_O$ 128. In general, the output quantity $U_O$ 128 is either an output voltage $V_O$ 124, an output current $I_O$ 122, or a combination of the two. A sense circuit 130 is coupled to sense the output quantity $U_O$ 128 and to provide feedback signal $U_{FB}$ 131, which is representative of the output quantity $U_O$ 128. Feedback signal $U_{FB}$ 131 may be a voltage signal or a current signal. In one example, the sense circuit 130 may sense the output quantity $U_O$ 128 from an additional winding included in the energy transfer element T1 114.

In another example, there may be galvanic isolation (not shown) between the controller 138 and the sense circuit 130. The galvanic isolation could be implemented by using devices such as an opto-coupler, a capacitor, or a magnetic coupling. In a further example, the sense circuit 130 may utilize a voltage divider to sense the output quantity $U_O$ 128 from the output of the power converter 100.

The cascode circuit 129 includes a normally-on switch 132 and the control switch 135. In one example, the normally-on switch is a high electron mobility transistor (HEMT). In this example, the normally-on switch is comprised of a gallium nitride (GaN) material. In another example, the normally-on switch would work similarly with a JFET comprised of a silicon carbide (SiC) material.

The control switch 135 includes a normally-off switch 134 and a first sense finger 136 and second sense finger 137. The gate of normally-off switch 134 is coupled to the gate of first sense finger 136 and to the gate of second sense finger 137. To improve the accuracy of current sensing, there is a general ratio of resistance for the first sense finger 136 and the second sense finger 137 to the resistance $RDS_{ON}$ of the normally-off switch 134.

The gate of the normally-on switch 132 is coupled such that it is OFF when the series normally-off switch 134 is OFF. In the example, the gate of the normally-on switch 132 is tied to the source terminal of the normally-off switch 134, which causes the normally-on switch 132 to be turned OFF when the drain-source voltage across the normally-off switch 134 results in a negative gate-source voltage for normally-off switch 134 that pinches off the channel of normally-on switch 132.

Current sense circuit 140 is coupled to receive the source signal $U_S$ 148 of the normally-on switch 132, a first sense finger signal $U_{C1}$ 149, a second sense finger signal $U_{C2}$ 150, and outputs a current limit signal $U_{CL}$ 153 and an overcurrent signal $U_{OC}$ 152. Control circuit 142 is coupled to output a control signal $U_{CONT}$ 154 in response to the feedback signal $U_{FB}$ 131, the current limit signal $U_{CL}$ 153, the overcurrent signal $U_{OC}$ 152.

In operation, the first sense finger signal $U_{C1}$ 149 is generated by the drain of sense finger 136 and the current source $I_{MOD}$ 147. The reference value of current source $I_{MOD}$ 147 can be used, in an example, for regulating the output voltage, or the ON time of the cascode circuit 129. The first sense finger 136 and second sense finger 137 provides a proportional resistance in relation to the normally-off switch 134. The second sense finger signal $U_{C2}$ 150 is generated by the drain of sense finger 137 and the current source $I_{MAX}$ 146. The reference value of current source $I_{MAX}$ 146 is selected to represent the maximum current limit of the power converter. The additional second sense finger in the normally-off switch 135 can improve the accuracy of the sense finger signal $U_{C2}$ 150 over temperature and part variations. However, in some applications, the lower accuracy of the sense finger signal $U_{C2}$ 150 can be tolerated because it is used to generate the signal which is used to provide the protection of the converter. In one example, the second sense finger signal $U_{C2}$ 150 can be generated by current source $I_{MAX}$ 146 and a resistor (not shown). In some examples, the greater tolerances of the second sense finger signal $U_{C2}$ 150 can be tolerated using a resistor instead of using the second finger of the normally-off switch 135 to provide a cost effective and less complex implementation.

The drive circuit 144 is coupled to provide a drive signal $U_{DR}$ 133 in response to the control signal $U_{CONT}$ 154. The drive signal $U_{DR}$ 133 includes a multiple stage gate drive in which the first stage provides a weak turn on drive signal $U_{DR}$ 133 to turn control switch 135 on slowly to lower the EMI, and the second stage provides a strong turn on drive signal $U_{DR}$ 133 after a delayed time in order to fully turn on control switch 135 to provide accurate current sensing of control switch 135 quickly. Further description of the drive circuit will be provided in FIG. 3.

Figure 2:
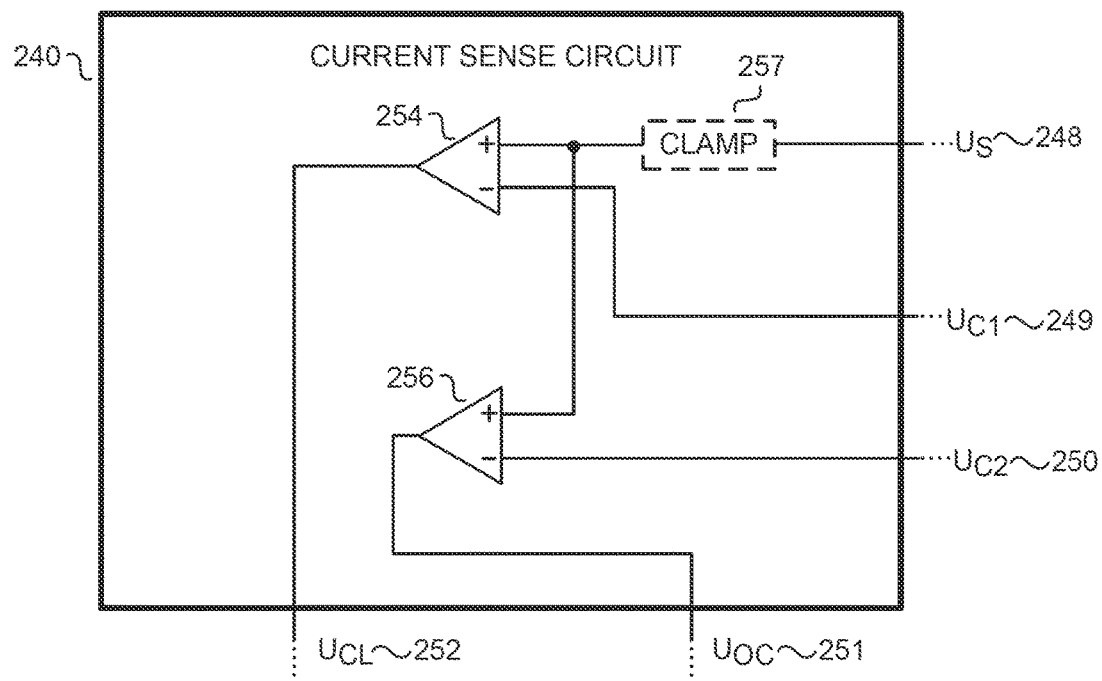
FIG. 2 is a block diagram illustrating an example current sense circuit of FIG. 1 in accordance with the teachings of the present invention.

FIG. 2 is a block diagram illustrating an example of a current sense circuit 240, which may be an example of current sense circuit 140 of FIG. 1, and similarly named and numbered elements referenced below may therefore be coupled and function similar to as described above. The current sense circuit 240 is coupled to receive the source signal $U_S$ 248 of normally-on switch 132, the first sense finger signal $U_{C1}$ 249, and the second sense finger signal $U_{C2}$ 250, and outputs a current limit signal $U_{CL}$ 252 and an overcurrent signal $U_{OC}$ 251. The current sense circuit 240 includes comparators 254 and 256, and an optional clamp circuit 257. Comparator 254 is coupled to the receive the source signal $U_S$ 248 at the non-inverting input, and the first sense finger signal $U_{C1}$ 249 at the inverting input, and outputs the current limit signal $U_{CL}$ 252. Current limit signal $U_{CL}$ 252 transitions to a logic high when the source signal $U_S$ 248 is greater than the sense finger signal $U_{C1}$ 249. Comparator 256 is coupled to receive the source signal $U_S$ 248 at the non-inverting input, and the second sense finger signal $U_{C2}$ 250 at the inverting input. The overcurrent signal $U_{OC}$ 251 transitions to a logic high when the source signal $U_S$ 248 is greater than the second sense finger signal $U_{C2}$ 250. The clamp circuit 257 is coupled to clamp the voltage range of the source signal $U_S$ 248.

Figure 3:
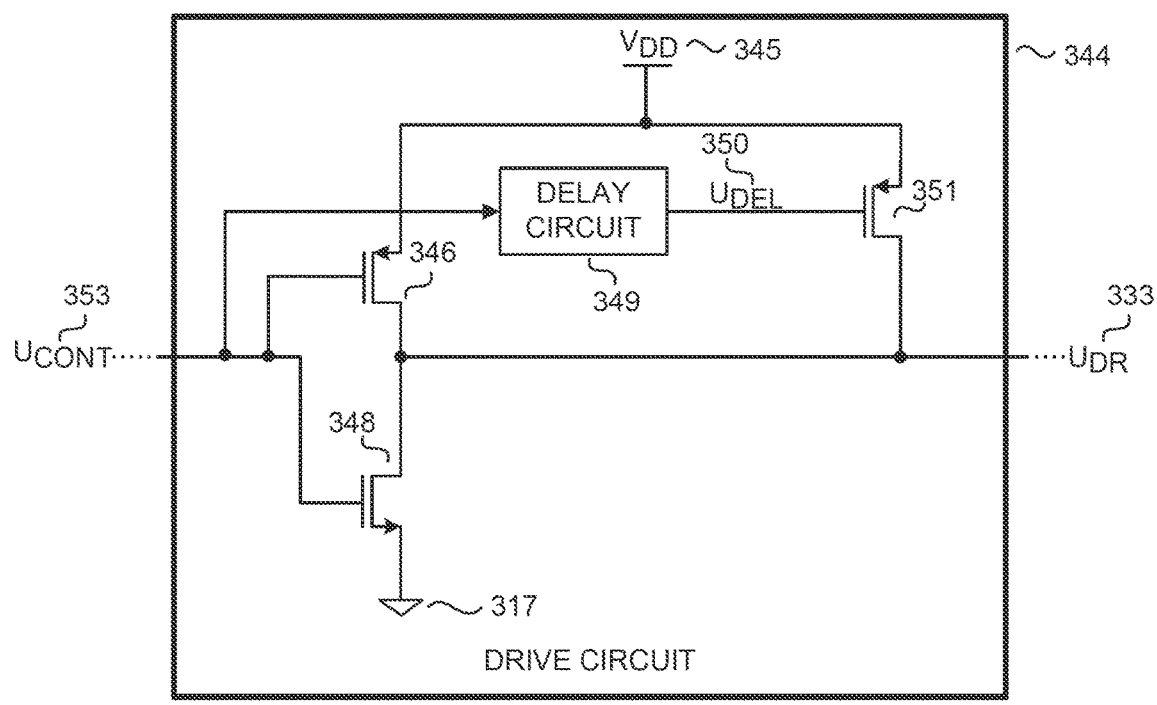
FIG. 3 is a block diagram illustrating an example driver circuit of FIG. 1 in accordance with the teachings of the present invention.

FIG. 3 is a block diagram illustrating an example of a drive circuit 344, which may be an example of drive circuit 144 of FIG. 1, and similarly named and numbered elements referenced below may therefore be coupled and function similar to as described above. Drive circuit 344 is coupled to receive the control signal $U_{CONT}$ 353 and output a drive signal $U_{DR}$ 333. The drive circuit 344 further includes transistors 346, 348, and 351, and a delay circuit 349.

Transistors 346 and 351 provide a weak turn on stage, and a strong turn on stage of a multiple stage gate drive. The control signal $U_{CON}$ 353 is coupled to the gate of transistor 346, transistor 348, and the delay circuit 349. The first stage of the multiple stage gate drive provides a weak turn on with transistor 346 for drive signal $U_{DR}$ 333 to turn the control switch on slowly to reduce the EMI. The weak turn on stage provides a weak turn on drive signal $U_{DR}$ 333 with transistor 346 when the drive signal $U_{DR}$ 333 is at a lower value relative to the drive circuit supply voltage (not shown). The strong turn on stage provides a strong turn on drive signal $U_{DR}$ 333 with transistor 351 when the drive signal $U_{DR}$ 333 is at a value that is higher than the lower value and close to the drive circuit supply voltage (not shown). Transistor 346 has a higher resistance than transistor 351. The delay circuit 349 is coupled to output a delay signal $U_{DEL}$ 350 to delay the activation of transistor 351 relative to the activation of transistor 346 in response to the control signal $U_{CON}$ 353. In the second stage of the multiple stage gate drive, the drive signal $U_{DR}$ 333 has a stronger turn on, which is produced by the low resistance of transistor 351 to quickly enhance the control switch 135 to provide accurate current sensing in accordance with the teachings of the present invention.

In operation, when the control signal $U_{CONT}$ 353 transitions to a logic low, transistor 348 is turned OFF, and transistor 346 is turned ON, which provides the weak turn on for drive signal $U_{DR}$ 333 to slowly turn on the control switch 135 to reduce EMI. The delay circuit 349 is coupled to delay control signal $U_{CONT}$ 350, and outputs a delayed control signal $U_{DEL}$ 353. The drive signal $U_{DR}$ 333 begins to rise in response to the weak turn on, and charges the normally-off switch 134, which remains turned OFF until the drive signal $U_{DR}$ 333 reaches the threshold voltage of the normally-off switch 134. When the drive signal $U_{DR}$ 333 reaches the threshold voltage of the normally-off switch 134, the normally-off switch 134 starts to turn-on and the source signal begins to fall and the normally-on switch 132 remains OFF because the voltage on the drain of normally-off switch 134 is greater than a turn on threshold of the normally-on switch 132. When the voltage on the drain of normally-off switch reaches the threshold of the normally-on switch 132, the normally-on switch 132 starts to turn-on and its drain voltage eventually reaches a value close to 0V when the normally-on switch 132 is completely turned-on. However, at that instant, the normally-off switch 134 is not fully enhanced and its drain-source resistance ($RDS_{ON}$) is not at a nominal value. When the delay of delay circuit 349 is over, the delayed control signal $U_{DEL}$ 353 is coupled to turn ON transistor 351, which provides the strong turn on for drive signal $U_{DR}$ 333. The drive signal $U_{DR}$ 333 now rises at a greater slope with the strong turn on provided by transistor 351 compared to the weak turn on provided by transistor 346 of the first stage. As a result, control switch 134 is now fully enhanced, and the drain-source resistance ($RDS_{ON}$) is at a nominal value, which provides accurate current sensing in accordance with the teachings of the present invention.

Figure 4:
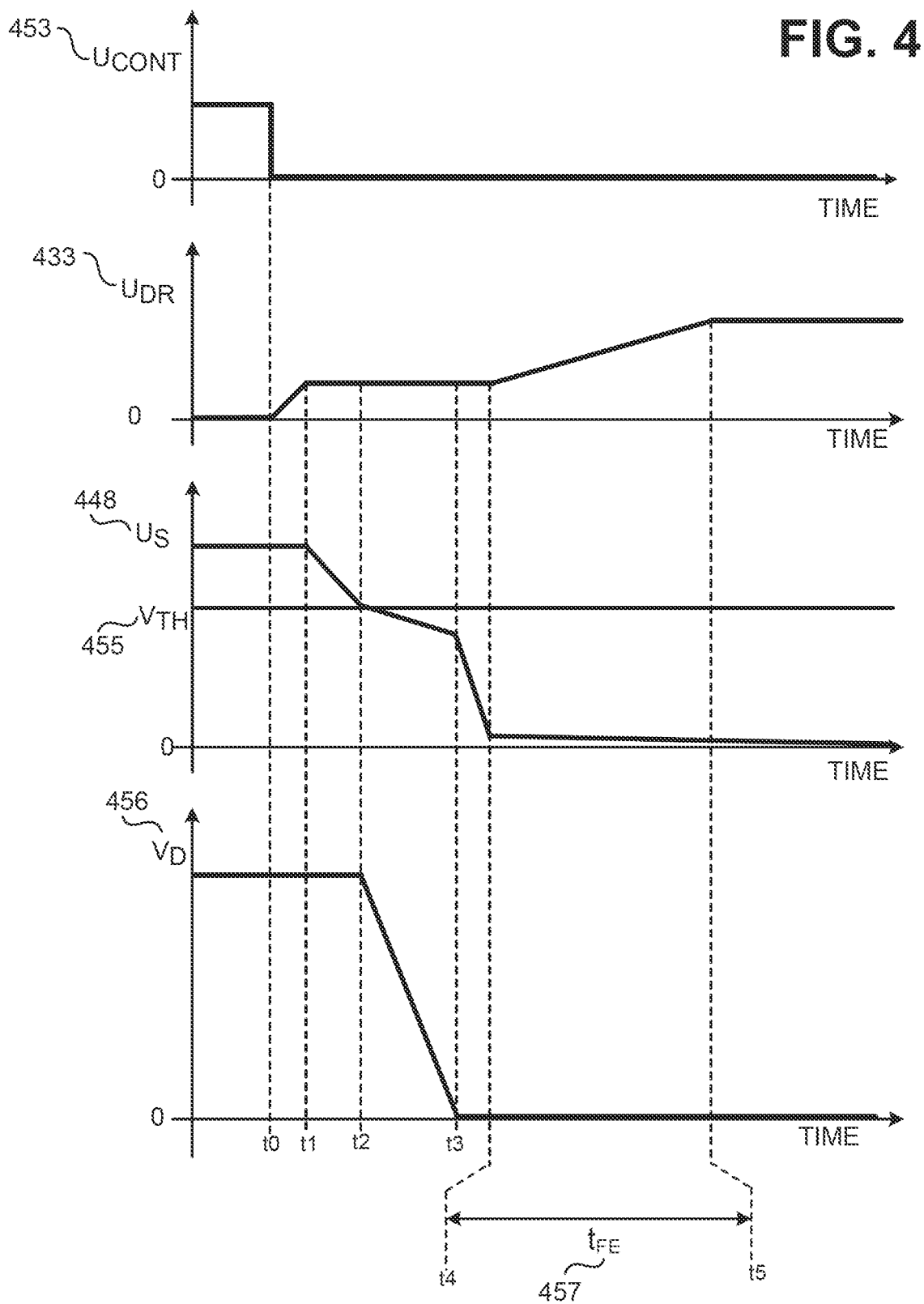
FIG. 4 is an example timing diagram illustrating one example of waveforms that show a control signal, a drive signal, a source signal, and a drain voltage in accordance with the teachings of the present invention.

FIG. 4 is an example timing diagram illustrating one example of waveforms that show a control signal, a drive signal, a source signal, and a drain voltage in accordance with the teachings of the present invention. In this example, the time for the control switch to become fully enhanced ($t_{FE}$ 457) takes longer in response to the controller not providing a multiple stage gate drive.

Before time t0, the control signal $U_{CONT}$ 453 is logic high, the drive signal $U_{DR}$ 433 is approximately zero. The source signal $U_S$ 448 is at a value above the threshold value $V_{TH}$ 455, which represents the threshold for turning on the normally-on switch. The drain voltage $V_D$ 456 of the normally-on switch is a high value.

At time t0, the control signal $U_{CONT}$ 453 transitions to a logic low. The drive signal $U_{DR}$ 443 begins to rise to the supply voltage. The source signal $U_S$ 448 is at a value above the threshold value $V_{TH}$ 455. The drain voltage $V_D$ 456 of the normally-on switch remains at a logic high.

At time t1, the source signal $U_S$ 488 begins to fall but is greater than the threshold $V_{TH}$ 455. The drain voltage $V_D$ 456 remains the same.

At time between t1 and t2, the source signal $U_S$ 448 is falling with a downward slope.

At time t2, the drive signal $U_{DR}$ 433 remains at nearly the same value due to the Miller capacitance. The source signal $U_S$ 448 is at a lower value than it was at time t1 and reaches the voltage threshold $V_{TH}$ 455 at instant t2. The drain voltage $V_D$ 456 begins to fall with a downward slope.

At time between t2 and t3, the drive signal $U_{DR}$ 433 remains at a nearly constant value due to the Miller capacitance. The source signal $U_S$ 448 falls below the voltage threshold $V_{TH}$ 455. The drain voltage $V_D$ 456 falls with a downward slope towards zero.

At time t3, the drive signal remains at the nearly same value. The source signal $U_S$ 448 has fallen below the voltage threshold $V_{TH}$ 455, and continues to fall with a downward slope that is greater than the slope during time period t2 to t3. The drain voltage $V_D$ 456 is at nearly zero volts.

At time t4, the drive signal begins to rise towards the supply voltage of the drive circuit. The source signal $U_S$ 448 is close to zero. The drain voltage $V_D$ 456 is close to zero volts.

At time between t4 and t5, the drive signal continues to rise. Although the control switch is turned ON, the drive signal $U_{DR}$ 433 is not high enough to fully enhance the normally-off switch and the control requires a time between defined as the fully enhanced time $T_{FE}$ 457, where the control switch is able to provide a nominal resistance $RDS_{ON}$.

At time t5, the drive signal $U_{DR}$ 433 is close to the supply rail of the driver. The control switch is fully turned on and has a nominal resistance $RDS_{ON}$. The source signal $U_S$ 448 is at a very low value close to zero. The drain voltage $V_D$ 456 is at zero volts and the normally-on switch is completely turned ON.

Figure 5:
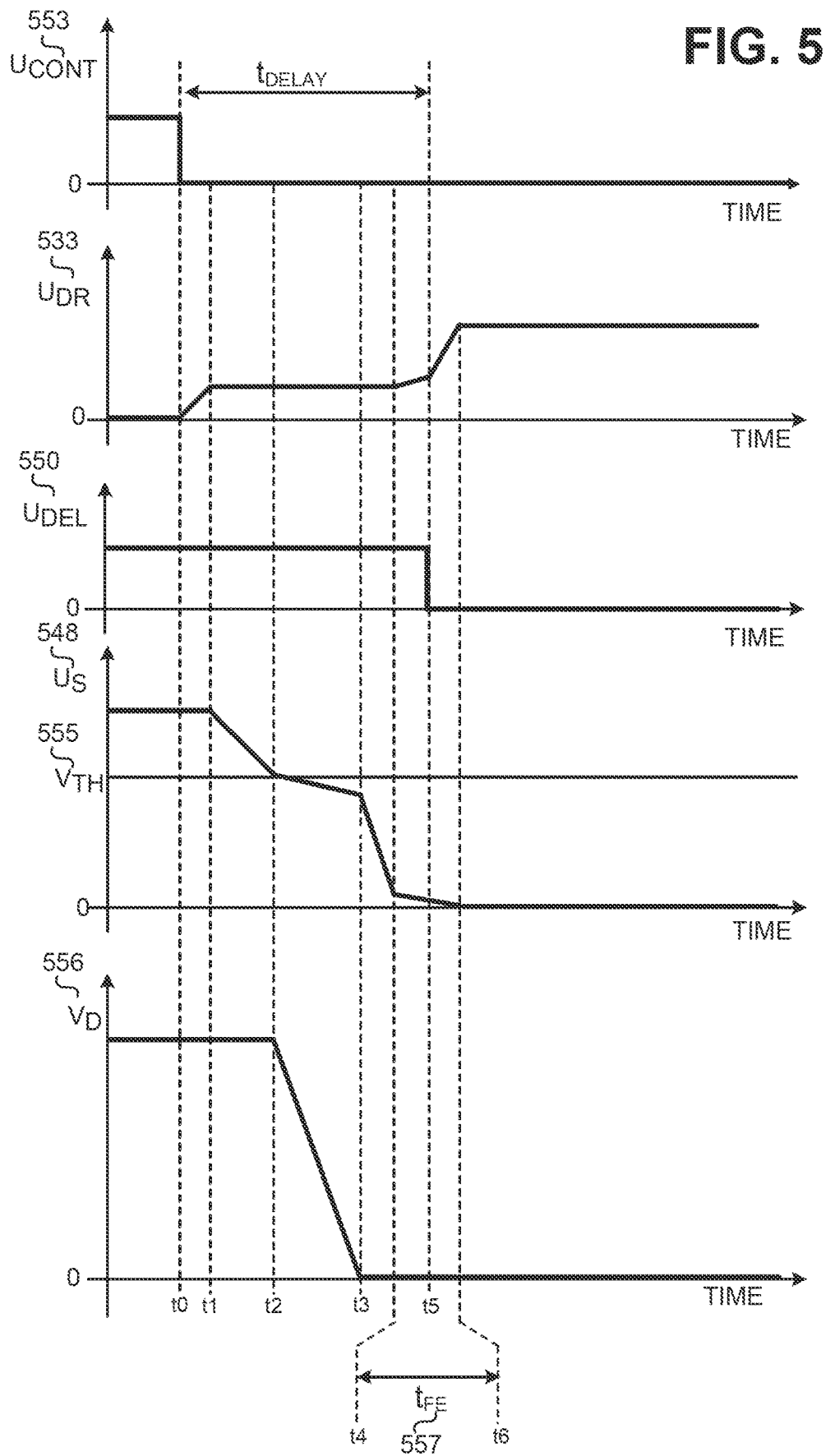
FIG. 5 is an example timing diagram illustrating another example of waveforms that show a control signal, a drive signal, a source signal, and a drain voltage in accordance with the teachings of the present invention.

FIG. 5 is an example timing diagram illustrating one example of waveforms that show a control signal, a drive signal, a source signal, and a drain voltage in accordance with the teachings of the present invention. In contrast to FIG. 4, the time ($t_{FE}$ 557) for the control switch to be fully enhanced a provide a nominal $RDS_{ON}$ is significantly less than the time shown previously by using the drive circuit described in FIG. 1 and FIG. 2.

Before time t0, the control signal $U_{CONT}$ 553 is at logic high. The drive signal $U_{DR}$ 533 is low. The delay signal $U_{DEL}$ 550 is logic high. The source signal $U_S$ 548 is greater than the voltage threshold $V_{TH}$ 555, which represents the threshold for turning on the normally-on switch. The drain voltage $V_D$ 556 is representative of the drain of the normally-on switch, which is at a high value.

At time t0, the control signal $U_{CONT}$ 553 transitions to a logic low. The drive signal $U_{DR}$ 533 is at a low value. The source signal $U_S$ 548 is greater than the voltage threshold $V_{TH}$ 555. The drain voltage $V_D$ 556 is at a high value.

At time between t0 and t1, the drive signal $U_{DR}$ 533 rises with an upward slope towards the drive circuit supply voltage. The delay signal $U_{DEL}$ 550 remains logic high. The source signal $U_S$ 548 is at the same value and remains greater than the voltage threshold $V_{TH}$ 555. The drain voltage $V_D$ 556 is at a high value.

At time t1, the drive signal $U_{DR}$ 533 reaches the threshold of the control switch and begins to turn on. The delay signal $U_{DEL}$ 550 remains at a logic high value. The source signal $U_S$ 548 is greater than the voltage threshold $V_{TH}$ 555.

At time between t1 and t2, the drive signal $U_{DR}$ 533 remains at the threshold value of the control switch due to the Miller capacitance, and the control switch continues turning on. The delay signal $U_{DEL}$ 550 remains at a logic high value. The source signal $U_S$ 548 begins to fall with a downward slope, but is still greater than the voltage threshold $V_{TH}$ 555. The drain voltage $V_D$ 556 is at a high value.

At time t2, the drive signal $U_{DR}$ 553 remains nearly at the threshold of the control switch due to the Miller capacitance, and the control switch continues turning on. The delay signal $U_{DEL}$ 550 remains at a logic high value. The source signal $U_S$ 548 is approaching the voltage threshold VT of the normally-on switch. The normally-on switch begins to turn on once the source signal $U_S$ 548 reaches the voltage threshold VT.

At time between t2 and t3, the drive signal $U_{DR}$ 553 remains nearly at the threshold of the control switch due to the Miller capacitance, and the control switch continues turning on. The source signal $U_S$ 548 is slightly below the voltage threshold $V_{TH}$ 555 of the normally-on switch and continues to turn ON.

At time t3, the drive signal $U_{DR}$ 553 remains nearly at the threshold of the control switch due to the Miller capacitance, and the control switch continues turning on. The delay signal $U_{DEL}$ 550 remains at a logic high value. The source signal $U_S$ 548 is below the voltage threshold of the normally-on switch, and the normally-on switch is completely turned ON. The drain voltage $V_D$ 556 is close to zero.

Between t3 and t4, the drive signal $U_{DR}$ 553 remains nearly at the threshold of the control switch due to the Miller capacitance, and the control switch continues turning on. The delay signal $U_{DEL}$ 550 remains at a logic high value. The source signal $U_S$ 548 is falling in a downward slope towards zero. The drain voltage $V_D$ 556 is close to zero.

At time t4, the drive signal $U_{DR}$ 553 remains nearly at the threshold of the control switch due to the Miller capacitance, and the control switch continues turning on. The delay signal $U_{DEL}$ 550 remains at a logic high value. The source signal $U_S$ 548 is at a very low value to zero. The drain voltage $V_D$ 556 is close to zero.

At time between t4 and t5 the drive signal $U_{DR}$ 553 begins to ramp towards the voltage supply rail of the drive circuit, but the control switch is not fully enhanced. The $RDS_{ON}$ of the control switch decreases as the drive signal increases. The delay signal $U_{DEL}$ 550 remains at a logic high value. The source signal $U_S$ 548 is close to zero. The drain voltage $V_D$ 556 is close to zero.

At instant t5, the delay signal $U_{DEL}$ 550 transitions to a logic low, and the second stage of the multiple stage gate drive is activated. The second stage of the multiple stage drive turns on transistor 351 of FIG. 3, which has a lower resistance than transistor 346. The source signal $U_S$ 548 approaches zero. The drain voltage $V_D$ 556 is close to zero.

At time between t5 and t6, the drive signal $U_{DR}$ 533 ramps up towards the supply voltage of the drive circuit. The source signal $U_S$ 548 approaches zero in a negative slope. The drain voltage $V_D$ is close to zero.

At time t6, the drive signal is close to the voltage of the supply rail of the driver. The control switch is fully turned ON and is fully enhanced. The time for the power switch to become fully enhanced ($t_{FE}$ 557) is less than the time to be fully enhanced as shown in FIG. 4.

Figure 6:
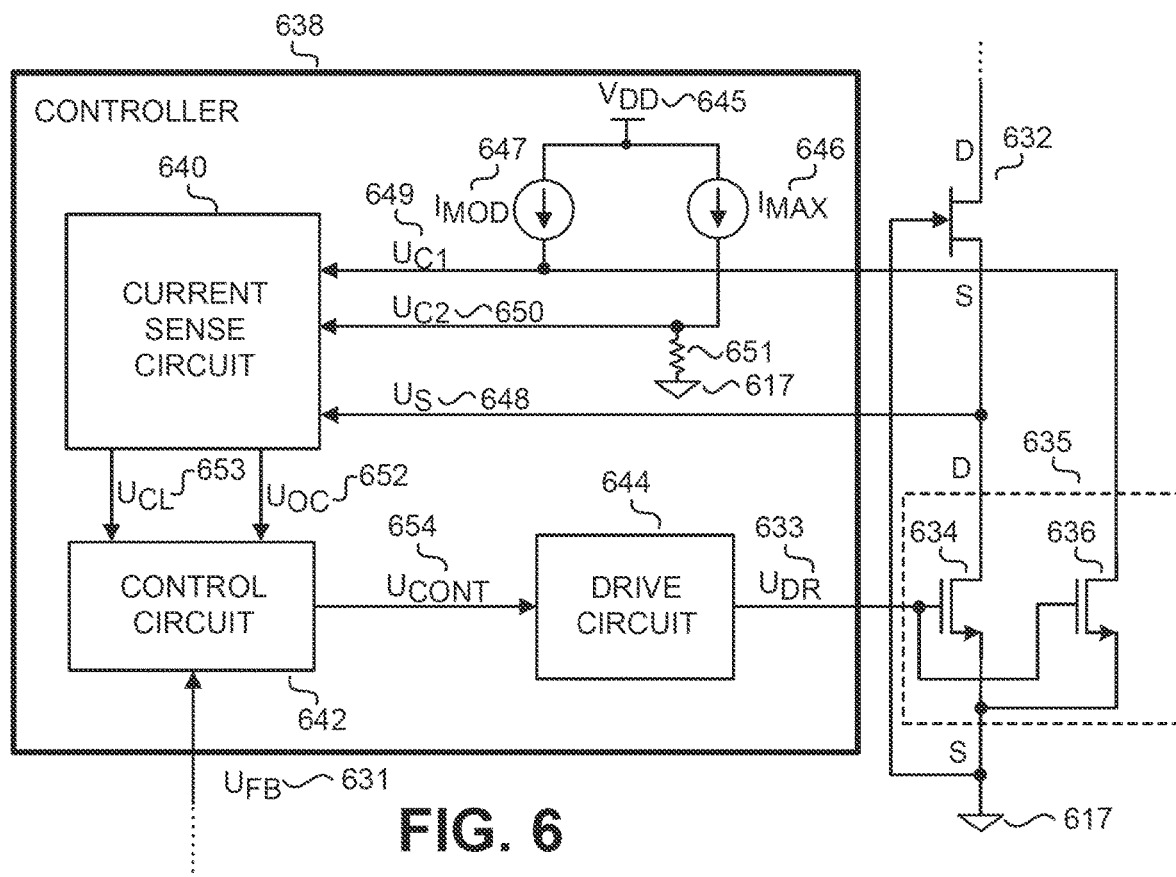
FIG. 6 is another example of a controller and a cascode switch in accordance with the teachings of the present invention.

FIG. 6 is another example of a controller for sensing a current of cascode switch in accordance with the teachings of the present invention. The cascode switch includes a control switch 635 and a normally-on switch 632.

The control switch 635 includes a normally-off switch 634 and a first sense finger 636.

The controller 638 is coupled to receive the source signal $U_S$ 648, first sense finger signal $U_{C1}$ 649, feedback signal $U_{FB}$ 631, and outputs a drive signal $U_{DR}$ 633 to the control switch 635. Controller 638 further includes a current sense circuit 640, a control circuit 642, and a drive circuit 644.

Current sense circuit 640 is coupled to receive the source signal $U_S$ 648 of the normally-on switch 632, the first sense finger signal $U_{C1}$ 649, a second sense finger signal $U_{C2}$ 650, and outputs a current limit signal $U_{CL}$ 653 and an overcurrent signal $U_{OC}$ 652.

Control circuit 642 is coupled to receive the feedback signal $U_{FB}$ 631, the current limit signal $U_{CL}$ 653, an overcurrent signal $U_{OC}$ 652, and outputs a control signal $U_{CONT}$ 654.

In operation, the first sense finger signal $U_{C1}$ 649 is generated by the drain of first sense finger 636 and the current source $I_{MOD}$ 647. The value of current source $I_{MOD}$ 647 is selected for regulating the output voltage, or the ON time of the cascode circuit. First sense finger 636 provides a proportional resistance to the switch 634. The second sense finger signal $U_{C2}$ 650 is generated by the current source $I_{MAX}$ 646 and the resistor 651. The reference value of current source $I_{MAX}$ 646 is selected to represent the maximum current limit of the power converter.

The drive circuit 644 is coupled to provide a drive signal $U_{DR}$ 633 in response to the control signal $U_{CONT}$ 654. The drive signal $U_{DR}$ 633 includes a multiple stage gate drive in which the first stage is a weak turn on to lower the EMI, and the second stage is a strong turn on after a delayed time in order to provide accurate current sensing in accordance with the teachings of the present invention.

Figure 7:
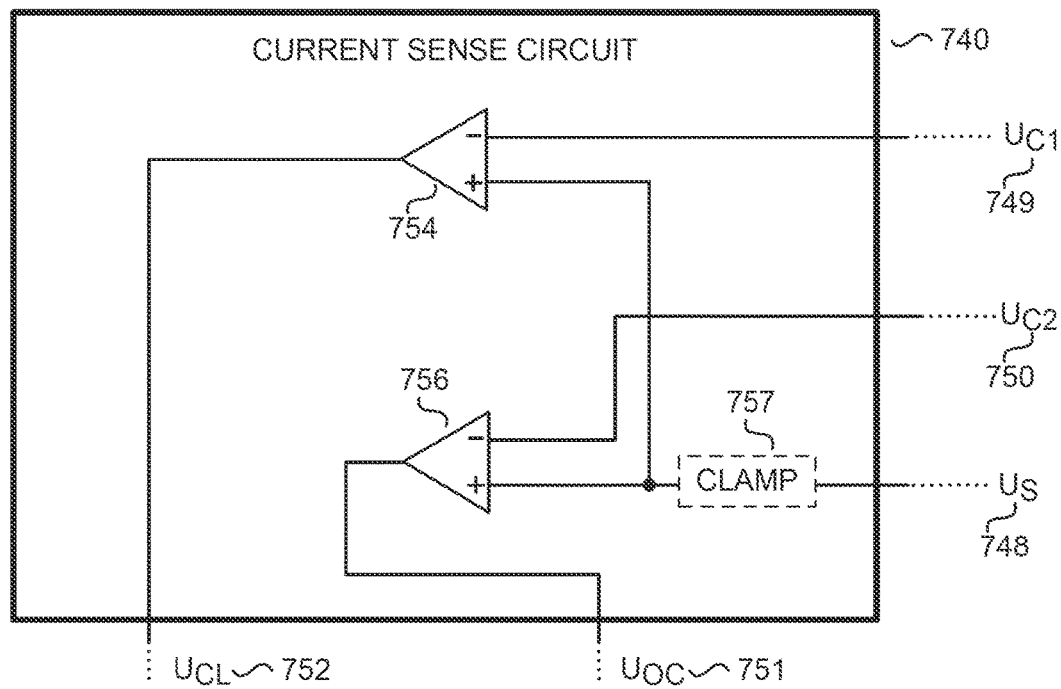
FIG. 7 is a block diagram illustrating an example current sense circuit of the example controller of FIG. 6, in accordance with the teachings of the present invention.

FIG. 7 is a block diagram illustrating one example of a current sense circuit 740, which may be an example of current sense circuit 140 of FIG. 1, or 640 of FIG. 6, and similarly named and numbered elements referenced below may therefore be coupled and function similar to as described above. The current sense circuit 740 is coupled to receive the source signal $U_S$ 748, the first sense finger signal $U_{C1}$ 749, and the second sense finger signal $U_{C2}$ 750, and outputs a current limit signal $U_{CL}$ 752 and an overcurrent signal $U_{OC}$ 751. The current sense circuit 740 includes comparators 754 and 756, and an optional clamp circuit 757. Comparator 754 is coupled to the receive the source signal $U_S$ 748, which in one example may be received through optional clamp circuit 757, at the non-inverting input, and the sense finger signal $U_{C1}$ 749 at the inverting input, and outputs the current limit signal $U_{CL}$ 752. Current limit signal $U_{CL}$ 752 transitions to a logic high when the source signal $U_S$ 748 is greater than the sense finger signal $U_{C1}$ 749. Comparator 756 is coupled to receive the source signal $U_S$ 248, which in one example may be received through optional clamp circuit 757, at the non-inverting input, and the second sense finger signal $U_{C2}$ 750 at the inverting input. The overcurrent signal $U_{OC}$ 751 transitions to a logic high when the source signal $U_S$ 748 is greater than the second sense finger signal $U_{C2}$ 750.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A power converter, comprising:
an energy transfer element coupled between an input of the power converter and an output of the power converter;
a cascode circuit coupled to the energy transfer element, the cascode circuit including a normally-on GaN switch and a control switch, the control switch configured to generate a first sense signal and a second sense signal;
a current sensor configured to generate a current limit signal and an overcurrent signal in response to the first sense signal and the second sense signal;
a control circuit configured to generate a control signal in response to the current limit signal and the overcurrent signal; and
a drive circuit configured to generate a drive signal in response to the control signal, wherein a first stage of the drive circuit is configured to provide the drive signal to reduce EMI, and a second stage of the drive circuit is configured to provide the drive signal to enable accurate current sensing of the cascode circuit.

2. The power converter of claim 1, wherein the first sense signal is generated by a drain of a first sense finger of the control switch and a first current source.

3. The power converter of claim 1, wherein the second sense signal is generated by a drain terminal of a second sense finger of the control switch coupled to a second current source.

4. The power converter of claim 1, the current sensor further coupled to receive a source signal generated by a source terminal of the normally-on GaN switch.

5. The power converter of claim 4, the current sensor comprising:
a first comparator configured to generate the current limit signal when the source signal is greater than the first sense signal; and
a second comparator configured to generate the overcurrent signal when the source signal is greater than the second sense signal.

6. The power converter of claim 4, the drive circuit comprising:
a first transistor configured to generate the drive signal of the first stage of the multiple stage gate drive circuit in response to the control signal;
a delay circuit configured to generate a delay signal in response to the control signal; and a second transistor configured to generate the drive signal of the second stage of the multiple stage gate drive circuit in response to the delay signal.

7. A controller configured for use in a power converter, comprising:
- a current sensor configured to generate a current limit signal in response to a first sense signal representative of a switch current of a control switch, the current sensor further configured to generate an overcurrent signal in response to a second sense signal for regulating an output voltage of the power converter;
- a control circuit configured to generate a control signal in response to the current limit signal and the overcurrent signal; and
- a multiple stage gate drive circuit configured to generate a drive signal for a cascode circuit in response to the control signal, wherein a first stage of the multiple stage gate drive circuit is configured to provide the drive signal to reduce EMI, and wherein a second stage of the multiple stage gate drive circuit is configured to provide the drive signal to enable current sensing of the cascode circuit.

8. The controller of claim 7, the current sense circuit comprising:
- a first comparator configured to generate the current limit signal in response to a source signal of the cascode circuit being greater than the first sense signal; and
- a second comparator configured to generate the overcurrent signal in response to the source signal being greater than the second sense signal.

9. The power converter of claim 7, the drive circuit comprising:
- a first transistor configured to generate the drive signal of the first stage of the multiple stage gate drive circuit in response to the control signal;
- a delay circuit configured to generate a delay signal in response to the control signal; and
- a second transistor configured to generate the drive signal of the second stage of the multiple stage gate drive circuit in response to the delay signal.

10. A controller configured for use in a power converter, comprising:
- a current sensor coupled to receive a first sense signal representative of a switch current of a control switch of a cascode circuit and a second sense signal for regulating an output voltage of the power converter of the control switch; and
- a drive circuit configured to generate a drive signal for the cascode circuit by use of a multiple stage gate drive circuit, wherein the drive signal provided by a first stage of the multiple stage gate drive circuit is configured to reduce EMI, and wherein the drive signal provided by a second stage of the multiple stage gate drive circuit is configured to enable current sensing of the cascode circuit.

11. The controller of claim 10, wherein a resistance of the first sense signal and the second sense signal is at a nominal value in response to the second stage of the multiple stage gate drive circuit.

12. The controller of claim 10, wherein the current sensor is configured to generate a current limit signal in response to the first sense signal, the current sense circuit further configured to generate an overcurrent signal in response to the second sense signal.

13. The controller of claim 12, further comprising a control circuit configured to generate a control signal in response to the current limit signal and the overcurrent signal.

14. The controller of claim 13, wherein the drive circuit is configured to generate the drive signal in response to the control signal.

* * * * *